United States Patent [19]
Barratt et al.

[11] Patent Number: 4,713,615
[45] Date of Patent: Dec. 15, 1987

[54] QUANTIZATION ERROR REDUCTION METHOD FOR PHASE ENCODE GRADIENT IN NMR IMAGING

[75] Inventors: Craig H. Barratt, Mountain View; Brian P. Wilfley, Los Gatos; David M. Parish, Sunnyvale, all of Calif.

[73] Assignee: Resonex, Inc., Sunnyvale, Calif.

[21] Appl. No.: 890,594

[22] Filed: Jul. 25, 1986

Related U.S. Application Data

[63] Continuation-in-part of Ser. No. 771,068, Aug. 30, 1985.

[51] Int. Cl.[4] ............................................. G01R 33/20
[52] U.S. Cl. ..................................... 324/307; 324/309
[58] Field of Search ............... 324/300, 307, 309, 311, 324/312, 313, 314

[56] References Cited

U.S. PATENT DOCUMENTS

| | | | |
|---|---|---|---|
| 4,384,255 | 5/1983 | Young et al. | 324/309 |
| 4,510,448 | 4/1985 | Riedl | 324/309 |
| 4,520,315 | 5/1985 | Loeffler et al. | 324/309 |
| 4,585,995 | 4/1986 | Flugan | 324/322 |
| 4,591,789 | 5/1986 | Glover et al. | 324/307 |
| 4,625,170 | 11/1986 | Yamamoto et al. | 324/309 |
| 4,670,716 | 6/1987 | Kunz | 324/309 |

Primary Examiner—Stewart J. Levy
Assistant Examiner—Scott M. Oldham
Attorney, Agent, or Firm—Flehr, Hohbach, Test, Albritton & Herbert

[57] ABSTRACT

In an improved NMR imaging method, where three-nominally orthogonal gradient fields are generated, the quantization error of the phase encode gradient is reduced without the necessity of a digital to analog converter of higher bit capacity. This is accomplished in one embodiment by providing a second smaller gradient waveform which is relatively narrow compared to the primary gradient waveform, the ratio of the waveforms being proportional to the improved resolution. The second waveform can occur either before or after the 180° excitation pulse used to produce a spin-echo signal. In another embodiment pulse width modulation is used to vary the area of the phase encode waveform in discrete increments.

10 Claims, 18 Drawing Figures

QUANTIZATION ERROR REDUCTION METHOD FOR PHASE ENCODE GRADIENT IN NMR IMAGING

RELATED APPLICATIONS

This is a continuation-in-part of an application filed Aug. 30, 1985, Ser. No. 771,068, in the name of Craig H. Barratt, entitled Quantization Error Reduction Method For Phase Encode Gradient in NMR Imaging.

FIELD OF THE INVENTION

This invention relates to an imaging method for nuclear magnetic resonance (NMR), and more particularly to a process for correcting the quantization error of a phase encode gradient waveform.

BACKGROUND OF THE INVENTION

As disclosed in the co-pending patent application entitled: A Process for Non-Orthogonal NMR Imaging" filed: Aug. 27, 1985, Ser. No. 769,939, with Arthur Lim, Michael Buonocore, and Craig Barratt, as inventors, a technique of non-orthogonal NMR imaging is discussed. Because of non-idealities in the NMR system, such nonorthogonal imaging has been difficult to accomplish. The technique as described there involves forming by a digital method the various gradient waveforms and then by a digital to analog converter converting them to analog forms suitable for application to various gradient coils.

Such digital to analog conversion inherently involves a quantization error. In other words, the values of, for example, the phase encoding waveform amplitude must be rounded off to the nearest digital to analog converter (DAC) value. A common solution to this problem in the past, where merely orthogonal imaging was being accomplished, was to provide phase encoding steps of exact multiples of a DAC step size. This will not work in a non-orthogonal technique. However, even in a non-orthogonal technique, another solution is merely providing digital to analog converters with higher resolution; for example, 16 bit DACs versus 12 bit DACs. However, such converters must be high speed, glitch-free and have extremely good linearity; such converters are expensive. Thus, it is desired to be able to utilize a lower cost and lower resolution digital to analog converter and still minimize the effects of quantization errors.

OBJECTS AND SUMMARY OF INVENTION

It is the object of the present invention to provide a quantization error reduction method for the phase encode gradient in NMR imaging.

In accordance with the above object, there is provided a method for a nuclear magnetic resonance (NMR) imaging apparatus having gradient coils driven by gradient waveforms. The gradient waveforms are produced by digital to analog converters having a predetermined quantization error. In the NMR apparatus there is a phase encode waveform for providing an image of a subject. Such waveform, by a variation of its area, provides a parameter to spatially encode the image. The method comprises steps of: (1) determining desired areas for the phase encode waveform; (2) a theoretical area error is determined from the desired areas due to the quantization error; (3) a first phase encode waveform is provided having a rounded-off area relative to the desired area; (4) at least one additional phase encode waveform is provided which is in the same spin-echo sequence as the first phase encode waveform, the additional waveform having an area substantially equal to the area error, the additional waveform being substantially smaller in area than the first waveform.

From a broader aspect, the method includes the foregoing method as defined above in the preamble and includes the step of, in the same spin-echo sequence, providing at least one phase encode waveform having amplitudes to avoid the quantization error and then the step of varying the effective area of the phase encode waveform in the spin-echo sequence through a predetermined plurality of discrete increments while still maintaining the quantization error avoiding amplitudes.

One more specific technique in accordance with the invention includes the steps of providing at least one phase encode waveform having fixed maximum positive and negative polarity amplitudes with a transition through a zero level, the location and time of the transition determining the area of the phase encode waveform. Then the area of the phase encode waveform is varied in a plurality of discrete phase encoding steps by changing the location in time of the transition.

DETAILED DESCRIPTION OF THE INVENTION

Figure 1:
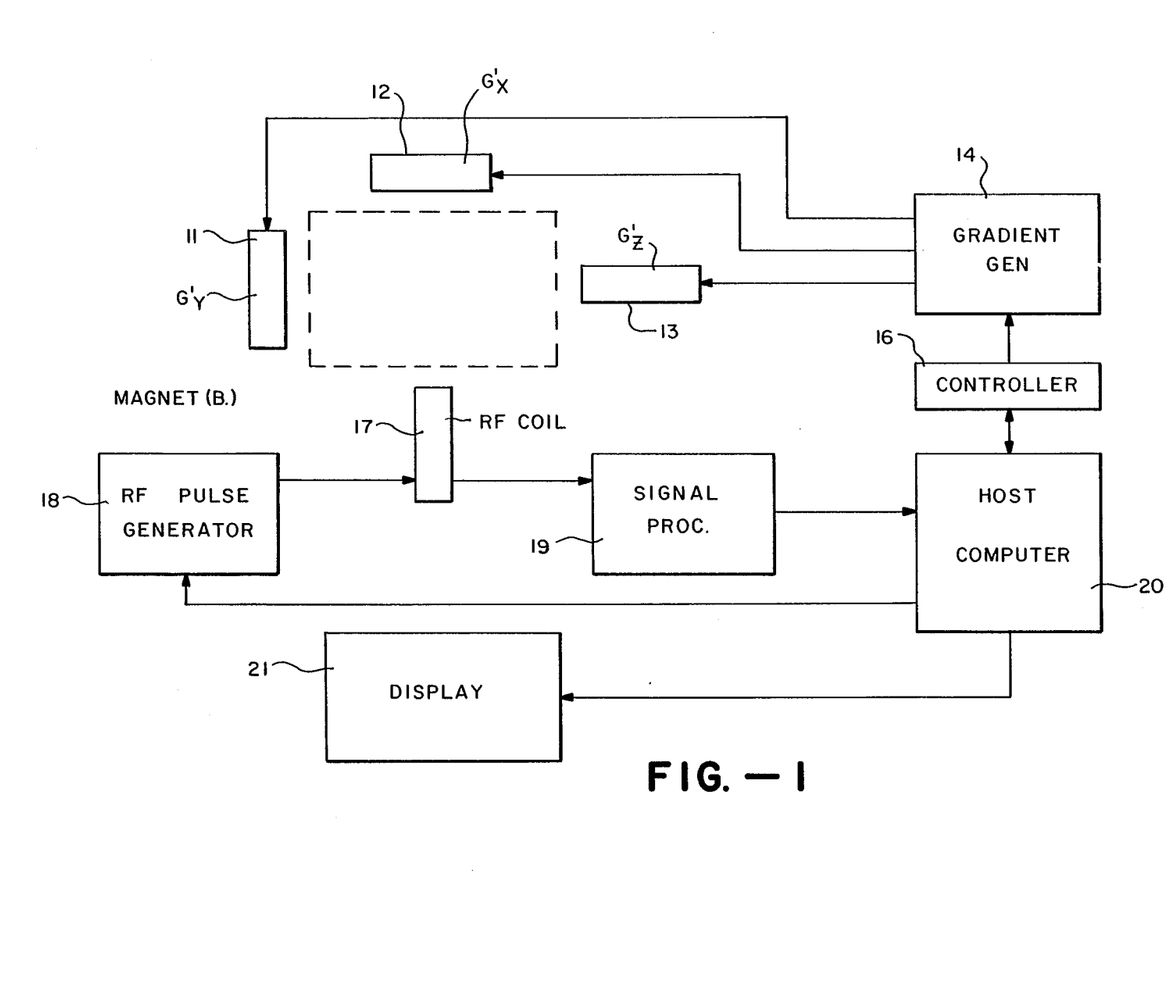
FIG. 1 is a block diagram of an NMR system embodying the present invention.

FIG. 1 illustrates an NMR system which in its block diagram form is of a standard type. However, with the process of the present invention, it is possible to utilize the improved method.

Referring specifically to FIG. 1, the main magnet 10 provides a magnetic field Bo which generates a static magnetic field realizing a polarization of the nuclei of the subject. Within magnet 10 therefore is a cavity or space in which the specimen or human to be examined is placed.

The apparatus also includes a gradient system utilized for producing spatial linear field gradients. These gradient fields are conventionally established by the use of a set of three orthogonal direct current coils which generate the three principal gradients, $G'x$, $G'y$ and $G'z$. The coils themselves are numbered 11 through 13, and are driven by a gradient generator 14, which in turn is controlled by a controller 16 which communicates with a host computer 20.

Finally, the third component of the typical NMR system includes the radio frequency (RF) coil 17, which generates radio frequency fields in the subject being analyzed and picks up the free induction decay or spin echo signal which is generated after termination of the radio frequency pulse. For exciting RF coil 17 there is an RF pulse unit 18. The signal processor 19 receives the small microvoltage level spin echo signals generated by the subject and these are processed by computer 20 to form an image. Generally the image is digitized in an analog to digital converter and stored in the memory section of computer 20 for later display by means of a display 21 which may typically be a cathode ray tube. This reconstructed image on a cathode ray tube has a resolution determined by the number of pixels (for example, 128 or 256) across each horizontal scan line of the CRT.

Figure 2:
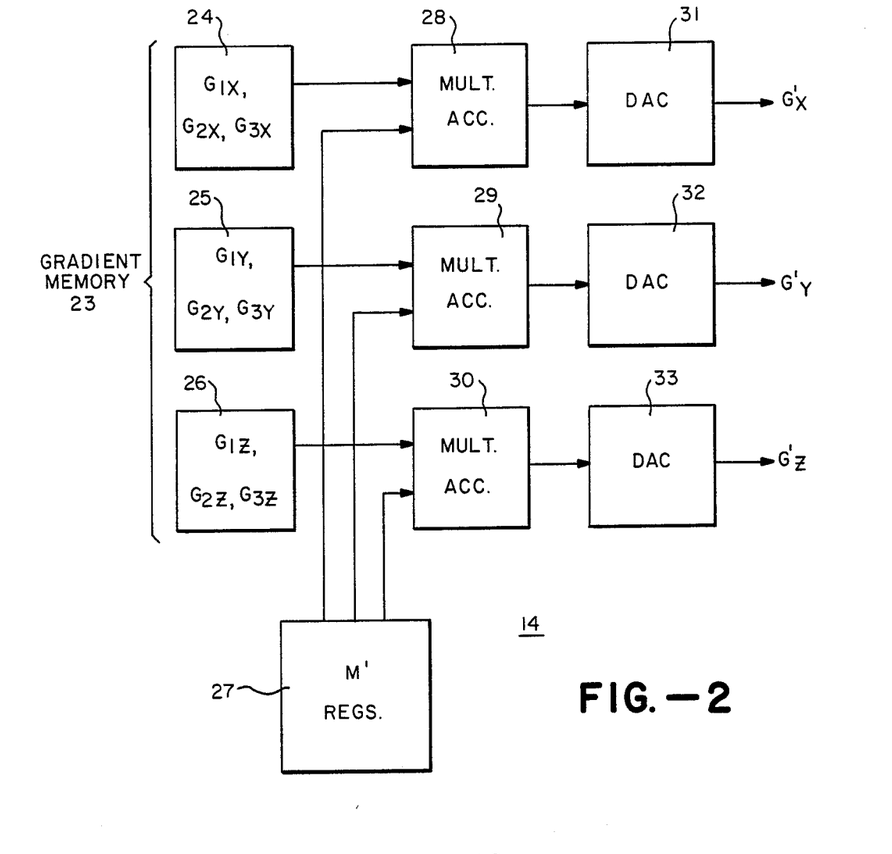
FIG. 2 is a more detailed block diagram of a portion of FIG. 1.
Figure 4A:
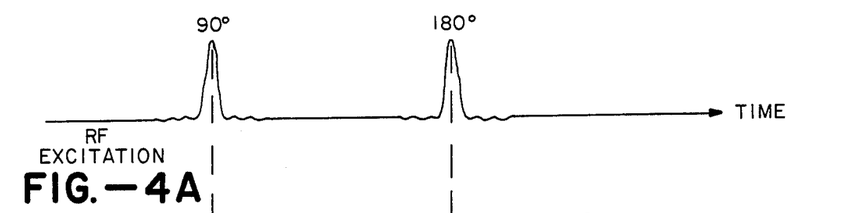
FIG. 4A shows RF excitation pulses.
Figure 4B:
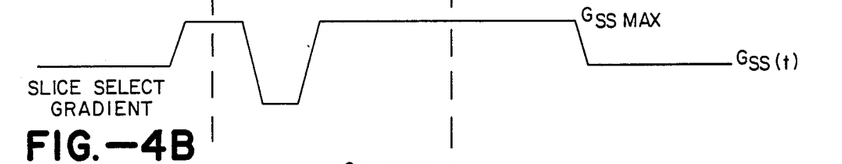
FIGS. 4B, 4C and 4D show related gradient waveforms.
Figure 4C:
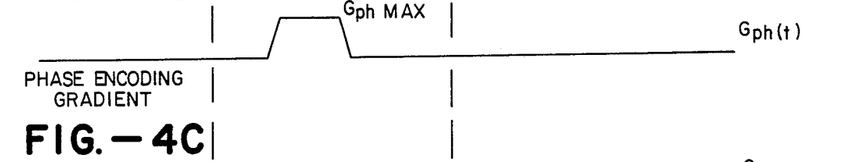
Figures 4D, 4E:
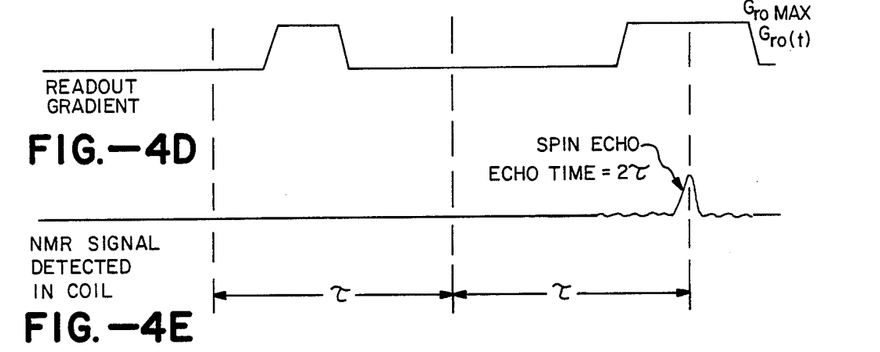
FIG. 4E shows an NMR signal as detected.

FIG. 2 shows the circuit and details of the gradient generator 14 for generating the gradient waveforms for driving the three coils 11, 13 and 14. It includes a dual port memory 23, which includes individual orthogonal gradient memories 24, 25 and 26 corresponding to G′x, G′y and G′z, respectively. As described in the above co-pending application and as illustrated in equations 1, 2 and 3 shown at the end of this application, 3 gradient waveforms for each axis are stored in memory 23 which have been calibrated and compensated for each individual axis. In the present application, equations 4, 5 and 6 define these various orthogonal gradients as relating to a readout gradient, a phase encode gradient and a slice select gradient. These waveforms are also illustrated in FIGS. 4B, 4C and 4D. These individual orthogonal gradient waveforms are digitally read out under the control of controller 16 (FIG. 1). In multiplier accumulators 28, 29 and 30, they are multiplied with various matrix multiplying values "M′" from the "M′" registers 27. These "M′" values are defined as illustrated in equations 7, 8 and 9 and as also discussed in the above co-pending application.

The present invention modifies in one embodiment, as will be explained below, the "M′" values related to the phase encode gradient. Specifically, these are M′$_{12'}$, M′$_{22'}$ and M′$_{32}$. Next in order to accomplish the function illustrated by equations 1, 2 and 3, the multiplier accumulators 28, 29 and 30 multiply the various gradient functions by the proper "M′" values and the digital numbers are converted in the associated digital to analog converters 31, 32 and 33 to form the actual gradient waveforms which are applied, as currents, to their respective gradient coils as illustrated in FIG. 1. In the case of the present invention, the digital to analog converters have a 12 bit resolution. And as discussed they create a definite quantization error.

As discussed in the co-pending application, the present invention is best utilized with a spin echo signal. A typical imaging sequence in order to form an image, is illustrated in FIG. 4A through 4D. FIG. 4A shows a typical RF pulse and excitation signals for 90° and 180° with a time interval between the two signals of tau ($\tau$).

As illustrated in FIGS. 4B, 4C and 4D, three basic waveforms may be needed: These might be the slice select waveform of FIG. 4B; the phase encoding waveform of FIG. 4C, and the read out waveform of FIG. 4D.

As illustrated by FIG. 4E, the spin echo signal occurs at a time two tau ($2\tau$) after the 90° excitation pulse. The spin echo signal produces one line of data and the sequence shown in FIG. 4 can be defined as a spin echo sequence.

The overall operation of the invention is illustrated in FIG. 2 where the primes applied to the gradient waveforms G′$_x$, G′$_y$ and G′$_z$ indicate a rotated set of axes or coordinates. The rotation matrix coefficients "M" and their relationships with the angles phi, theta and omega, which are defined in the copending application are shown in equations 10 through 18.

Then as illustrated in equation 7, 8 and 9, the various "M" factors are actually multiplied or adjusted by various "K" factors. Specifically K$_{ss}$, the slice select strength, determines the thickness of the selected slice being imaged, and K$_{ph}$ and K$_{ro}$, the resolution. As will be discussed below, the present invention, in one embodiment, specifically concerns the adjustment of K$_{ph}$.

Basic matrix "M" values must be considered for each set of theta and phi values. This can be done by computer 20 or other manual controls. For convenience, the same conventions could be used here as in conventional X-ray angiography.

Figure 3:
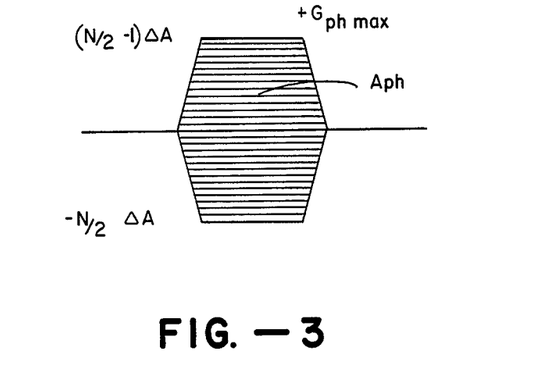
FIG. 3 is a waveform useful in understanding the funcing of a phase encode gradient.

FIG. 3 illustrates a typical phase encode gradient waveform. It illustrates how variation of its area provides a parameter to determine the pixels of the final image. In general, to produce an N×N image, "N" points of a spin echo are acquired at a sampling interval of Δt. This is repeated for "N" values of the phase encoding gradient (from negative maximum of the gradient to the positive maximum as shown in FIG. 3). This gives N$^2$ sample points which are reconstructed into an N×N image by using a two-dimensionsal Fourier transform. The size of the pixel, Δx, in the reconstructed image is determined as discussed above by both the readout gradient and the phase encode gradient. With respect to the readout gradient strength, resolution Δx, is shown in equation 19, where gamma (Δ) is the gyromagnetic constant (42.57 MHz/Tesla for Hydrogen); N number of pixels across the final image; Δt—sampling interval in seconds; and G$_{ro}$—readout gradient strength (Gauss/cm).

Thus, the Kro factor is adjusted, as shown in equations 7, 8 and 9, to provide the proper resolution. For the image to be square, the same resolution is desired in the phase encoding direction. This resolution is determined by the gyromagnetic constant, and the total area of the phase encoding pulse, as shown in equation 20. A$_{ph}$ is determined by, of course, integrating the area under the pulse.

During the "N" phase encoding steps in the imaging sequence, the area of the phase encoding pulse is stepped through the values as shown in equation 21, and as illustrated in FIG. 3.

Figure 4F:
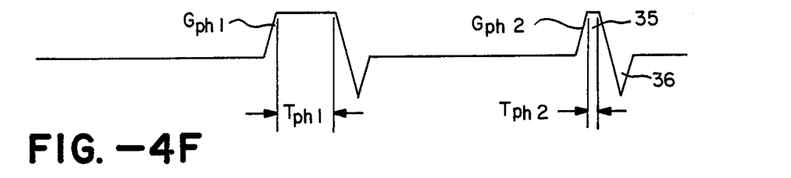
FIGS. 4F and 4G show phase encoding gradient waveforms modified in accordance with the present invention.
Figure 4G:
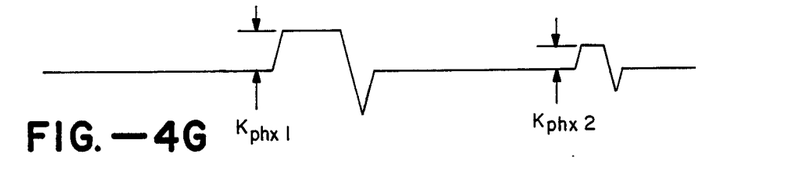

Equation 22 defines ΔA. Thus, from the foregoing, it is apparent that the area of the phase encoding gradient waveform is of prime importance in the NMR imaging process. This concept is utilized to reduce the effect of quantization errors as illustrated by the improved phase encoding waveform of FIG. 4F. Here the phase encoding pulse is broken into two areas, one being substantially smaller than the other. The second, however, has the same height for purposes of data manipulation as will be clear below. In the present invention the ratio of the two areas has been made equal to 25. Thus, the effective resolution (approximately 4½ bits) of the phase encoding pulse is increased by this factor R (see equation 35). During the actual imaging sequence, the height of these two pulses are controlled independently as illustrated in FIG. 4G, by using separate gradient multiplier coefficients $K_{phxl}$ and $K_{phx2}$ to determine the final height of the two pulses As illustrated in FIGS. 4F and 4G the second pulse may occur before or after the 180° RF excitation pulses (FIG. 4). If it occurs after, as illustrated, this allows more time for compensation as discussed in the copending application and the only thing that need be done is to provide for a negative polarity relative to the first pulse. Of course, the second pulse could be between the 90° and 180° excitation pulses. Another variation is to utilize additional phase encoding pulses to increase the resolution further. However, in general the concept is to provide a relatively narrow second pulse. As illustrated in FIG. 4F, the narrowness is illustrated as $T_{ph2}$ which is 1/25th of the width of the first pulse, which is $T_{ph1}$ (see equation 35).

Also in accordance with the invention, the second pulse of FIG. 4F includes a positive portion 35 and a negative portion 36, which when algebraically added leave only the narrow effective pulse having the width $T_{ph2}$. This is to allow a sufficient rise time in the pulses because of the inductance of the coils which they are driving. The same has been done as is apparent with the first pulse of FIG. 4F. Also by providing a relatively narrow second pulse, this in effect increases resolution, because of reduction in height of the second pulse, even though subject to the quantization errors of the same digital to analog converters (FIG. 2) has a much greater or multiplied effect. FIG. 4G illustrates the final first and second phase encode waveforms after the "K" correction factors have been applied. The second waveform has been significantly reduced in height.

From a broad standpoint, the height reduction of the second phase encode waveform, $K_{ph2}$, is carried out by determining the desired theoretical exact area for the phase encode waveform without quantization error, and then taking into account such quantization error in determining a theoretical area error. The area of the second pulse is determined by its "K" factor to substantially equal this area error (but, of course, never exactly since there is still some quantization error). This is done in practice by the computer 20 and is a simple routine illustrated by the following steps now to be described in detail.

Based on the desired resolution, $\Delta x$, the total phase encoding area $A_{ph}$ is computed as shown in equation 20. Next for each "i", that is pixel, where as illustrated in FIG. 3 "i" are the various steps going from the maximum negative to maximum positive portion of the phase encode waveform, there is calculated the theoretical areas for X, Y and Z phase encoding as shown in equations 23, 24 and 25. Note that the definitions of the "M" factors are in equation 11 for $M_{12}$; equation 14 for $M_{22}$ and equation 17 for $M_{32}$. Then utilizing the theoretically exact area A, which is desired, the theoretical "K" factor is computed for each of the X, Y and Z axes which will be multiplied against the phase encoding pulse of maximum height which is $G_{phmax}$, as illustrated in equations 26, 27 and 28. These "K'" values are theoretically desired but because of quantization error cannot be exactly reproduced. Thus, the computer 20 by well-known "integer" and "fraction" analysis effectively takes into account the quantization and calculates a "rounded-off" "K" value for the first phase encode waveforms as illustrated in equations 29, 30 and 31.

For example assume the INT(X) can be defined as the largest integer not larger than X. Thus, supposing the number was 4.2, this would provide a value of 4, or if a number were a $-3.2$, it would provide a value of a $-4$. In effect, these values are the same as if there was no compensation for quantization error. But they are "rounded-off."

Next, the "K" factor for the second phase encoding waveform is computed in equations 32, 33 and 34. Here the "R" factor is utilized and, of course, this is the relationship between pulse width of the two pulses. In effect the FRAC can be defined as the actual value of "X" minus the INT(X). Thus, for example, given an "X" value of 4.2, the FRAC of that would be 0.2, or given an "X" value of $-3.2$, the FRAC of that would be 0.8 The foregoing INT and FRAC functions are well-known in computer languages. The specific language used here is the UNIX "C" language, where the function "INT(X)" is called "floor(x)."

These "K" factors are computed for each pixel of data taken and by the use of equations 7, 8 and 9, they modify the various "M" functions, $M_{12}$, $M_{22}$ and $M_{32}$ to provide the "M'" functions which are then stored in the register 27, as illustrated in FIG. 2 to produce the final gradient waveforms.

As is described in more detail in the above copending application entitled A Process for Non-Orthogonal NMR Imaging, because of the complicated, rapidly varying gradient waveforms required for oblique imaging, it is desirable to combine them digitally and then after being formed into these digital combinations to convert them to analog form. Thus, the digital to analog converters with their attendant quantization errors are necessary. The foregoing technique while still incrementing the amplitude of the phase encode waveform from a minimum or negative area to a maximum or positive area, avoids or minimizes the quantization error even though adjusting amplitude by providing one phase encode pulse which has its amplitude rounded to the nearest quantization level. And then a second pulse is utilized with a smaller area. This means that with the same quantization step size, finer changes in area can be achieved with the second pulse. Thus, by the foregoing technique, a continuous range of resolution in pixels can be achieved, for example, half a millimeter to three or four millimeters per pixel.

Another technique to accomplish the foregoing without a significant quantization error, is to, in effect, pulse width modulate the phase encode gradient waveform. In other words, to step through the various areas of the phase encode waveform as illustrated in FIG. 3, for example, 256 steps in a row. But, rather than changing the amplitudes, the width of the pulse is changed.

Figure 5A:
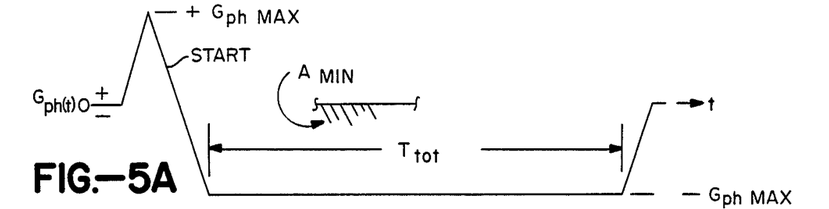
FIGS. 5A, 5B and 5C are phase encoding waveforms showing three different operating conditions of an alternative embodiment.
Figure 5B:
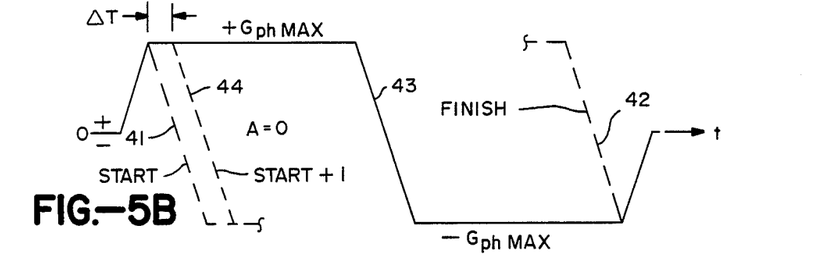
Figure 5C:
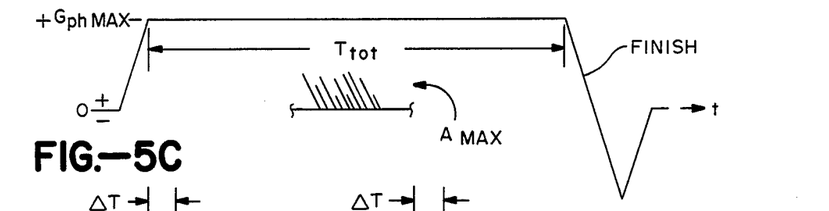

This is illustrated in FIGS. 5A, 5B and 5C, which show a phase encode waveform at its start, in the middle of its range, and at its finish in FIG. 5C. FIG. 5A shows the phase encode waveform at its start of the first row to be scanned and thus at that time, the area of the waveform designated $A_{min}$ is as shown by equation 36, in effect the total rectangular negative maximum area. Then FIG. 5C represents the termination of the scan where there is a positive maximum area, $A_{max}$ set out in equation 37, which is the product of the same time $T_{total}$ times the amplitude. FIG. 5B represents an area of zero since the positive and negative portions of the phase encode pulse are equal. FIG. 5B also illustrates in dashed outline the start transition 41 between the two maximum amplitude levels, the finish or termination transition at 42, which is FIG. 5C, the zero area transition 43 and the start plus one increment transition at 44.

Transition 44, which is a type of pulse width modulation, has thus been shifted a predetermined time interval ΔT. Thus, a change in area is provided in a number of discrete steps by shifting in time the location of the transitions 41, 42, etc. From a mathematical point of view, the transition from the largest negative area to the largest positive area through zero is shown by equation 38. In the equation $T_{tot}$ must subtracted by 2ΔT for each increment since, as is obvious from inspection of FIG. 5B, when the transition, for example, moves from the start 41 to 44, two rectangular areas are, in effect, subtracted from the total area of the phase encode waveform.

Next, as illustrated by equation 39, the total time to accomplish the incrementing from start to finish is the number of steps, N, times ΔT, the time increment. Equation 40 shows the incremental area change, (see also equation 22) as being equal to twice the maximum or minimum polarity areas divided by the number of steps. This is obvious from inspection.

To accomplish the foregoing, the gradient generator 14 illustrated in FIG. 1 is programmed to produce the incremented sequence of waveforms in accordance with equation 38. This is very straightforward. Thus, in this embodiment of the invention, there need be no change of M factor to accomplish the incremented change in area of the phase encode waveform as was necessary in the first additional waveform embodiment as implemented in equations 7, 8 and 30 through 34.

In order to change the area of the phase encode waveform without quantization error occurring, the maximum positive and negative amplitudes are choosen to be at a quantization level of the digital to analog converters.

Figures 5D, 5E:
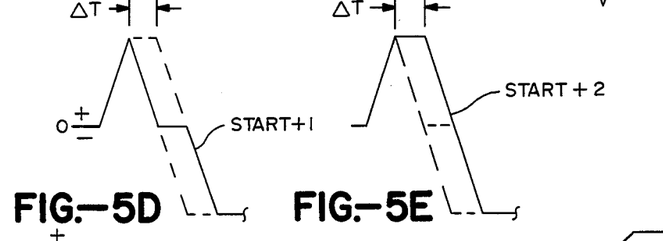
FIGS. 5D and 5E are partial phase encoding waveforms showing an alternative incrementing technique.

If a relatively rapid sequence of phase encode gradient waveforms is desired, it is possible that the minimum clockout rate of the associated hardware, for example, referring to FIG. 1 controller 16, might limit the sequence development. For example, assuming area increments of 256 steps with a ΔT of 10 microseconds, total time would be 2.56 milliseconds. And then some additional time must be added for the rise and fall which cancel each other out from an area standpoint. One technique for reducing this time is shown in FIGS. 5D and 5E where the transition is accomplished by moving the transition edge in two increments with each ΔT. Thus, as illustrated in FIG. 5D, only the negative portion is moved for the first increment. This is designated start plus 1, meaning the first increment. And then the second area increment is the upper or positive half of the waveform shown in FIG. 5E. Thus, for example, 256 phase encoding increments can be accomplished by the use of only 128 ΔT's. This requires only 1.28 milliseconds as opposed to the original 2.56 milliseconds. Thus summarizing each transition is accomplished in two increments with the zero level determining the increments. Of course, a greater number of increments could also be utilized to decrease time even less. Equation 41 describes the sequence of area changes for the above and equation 42 shows that the total time is, of course, one-half of that of the time in equation 39.

Figures 5F, 5G:
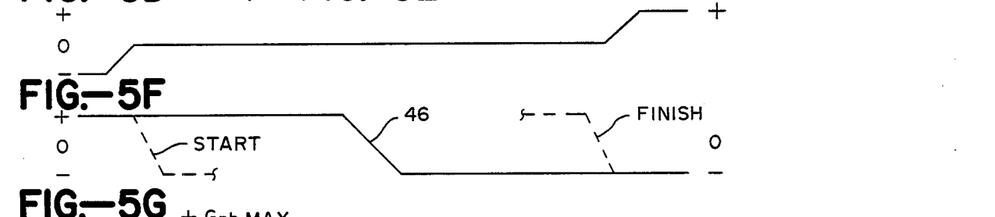
FIGS. 5F, 5G, and 5H are phase encoding waveforms analogous to FIGS. 5A, 5B and 5C but showing an alternative technique.
Figure 5H:
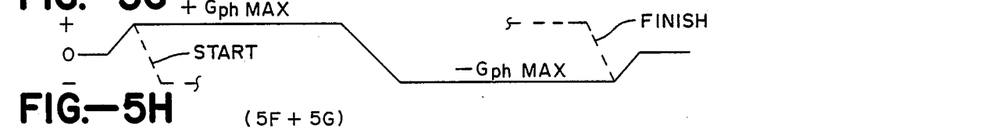

Another technique of generating the waveforms of FIGS. 5A, 5B and 5C, is illustrated in FIGS. 5F, 5G and 5H, where the two individual components of 5F and 5G are generated and then added to provide the final waveform of 5H which is equivalent to FIG. 5B. Thus, specifically, this is accomplished by generating the waveform of FIG. 5F which is a fixed waveform starting initially in time at a negative maximum polarity amplitude and making a transition immediately to the zero level, staying at the level for the major time portion of the waveform and then making a transition at its termination to the maximum positive polarity level. Then the waveform of FIG. 5G is a variable transition waveform which has a first portion in time at the opposite polarity as FIG. 5F, that is the positive polarity maximum amplitude, includes a transition 46 which then goes to the negative polarity maximum amplitude. The transition 46 is then varied as shown in dashed form from the start scan position to the finish scan position. When these two waveforms are combined as shown in FIG. 5H, they produce the desired gradient waveform equivalent to FIG. 5B.

The advantage of this technique is that the waveforms of FIGS. 5F and 5G can be filtered beforehand. The process of shifting and adding still results in a valid waveform. All of the foregoing, of course, can be accomplished by the controller 16 of FIG. 1.

Thus, referring both to the pulse width modulation technique and the use of an additional phase encoding pulse, both of these techniques avoid a quantization error. By pulse width modulation, the changing of amplitudes is totally avoided. With the additional phase encode pulse technique, the effect of quantization error in amplitude is minimized since the initial phase encode waveform has its amplitudes at a definite quantization level. Lastly, both of the above techniques easily accomodate continuous variation of resolution.

Thus, an improved method for NMR imaging has been provided which reduces quantization error of the phase encode gradient. This is without the necessity of a digital to analog converter of higher resolution capacity.

EQUATIONS $$G'_x = M'_{11}G_{1x} + M'_{12}G_{2x} + M'_{13}G_{3x} \tag{1}$$

$$G'_y = M'_{21}G_{1y} + M'_{22}G_{2y} + M'_{23}G_{3y} \tag{2}$$

$$G'_z = M'_{31}G_{1z} + M'_{32}G_{2z} + M'_{33}G_{3z} \tag{3}$$

$$G_{1x} = G_{rox} \quad G_{2x} = G_{phx} \quad G_{3x} = G_{ssx} \tag{4}$$

$$G_{1y} = G_{roy} \quad G_{2y} = G_{phy} \quad G_{3y} = G_{ssy} \tag{5}$$

$$G_{1z} = G_{roz} \quad G_{2z} = G_{phz} \quad G_{3z} = G_{ssz} \tag{6}$$

$$M'_{11} = M_{11}K_{ro} \quad M'_{12} = M_{12}K_{ph} \quad M'_{13} = M_{13}K_{ss} \tag{7}$$

$$M'_{21} = M_{21}K_{ro} \quad M'_{22} = M_{22}K_{ph} \quad M'_{23} = M_{23}K_{ss} \tag{8}$$

$$M'_{31} = M_{31}K_{ro} \quad M'_{32} = M_{32}K_{ph} \quad M'_{33} = M_{33}K_{ss} \tag{9}$$

$$M_{11} = \cos\Omega \cos\phi \cos\theta - \sin\Omega \sin\phi \tag{10}$$

$$M_{12} = -\sin\Omega \cos\phi \cos\theta - \cos\Omega \sin\phi \tag{11}$$

$$M_{13} = \cos\phi \sin\theta \tag{12}$$

$$M_{21} = \cos\Omega \sin\phi \cos\theta + \sin\Omega \cos\phi \tag{13}$$

$$M_{22} = \cos\Omega \cos\phi - \sin\Omega \sin\phi \cos\theta \tag{14}$$

$$M_{23} = \sin\Omega \sin\theta \tag{15}$$

$$M_{31} = \cos\phi \sin\theta \tag{16}$$

$$M_{32} = \sin\phi \sin\theta \tag{17}$$

$$M_{33} = \cos\theta \tag{18}$$

-continued
EQUATIONS $$\Delta X = \frac{1}{\gamma N \Delta t G_{ro}} \quad (19)$$

$$\Delta X = \frac{1}{2A_{ph}} \quad (20)$$

$$-\frac{N}{2}\Delta A, \left(-\frac{N}{2}+1\right)\Delta A, \ldots, -\Delta A, 0, \Delta A, \ldots, \quad (21)$$

$$\left(\frac{N}{2}-1\right)\Delta A$$

$$\Delta A = \frac{2}{N} A_{ph} \quad (22)$$

$$A_{phx} = \frac{i}{N/2} A_{ph} M_{12} \quad (23)$$

$$A_{phy} = \frac{i}{N/2} A_{ph} M_{22} \quad (24)$$

$$A_{phz} = \frac{i}{N/2} A_{ph} M_{32} \quad (25)$$

$$K'_{phx} = \frac{A_{phx}}{\gamma T_{ph1} G_{phmax}} \quad (26)$$

$$K'_{phy} = \frac{A_{phy}}{\gamma T_{ph1} G_{phmax}} \quad (27)$$

$$K'_{phz} = \frac{A_{phz}}{\gamma T_{ph1} G_{phmax}} \quad (28)$$

$$K_{phx1} = \text{INT}\left(\frac{K'_{phx}}{\Delta K_{dac}}\right) \Delta K_{dac} \quad (29)$$

$$K_{phy1} = \text{INT}\left(\frac{K'_{phy}}{\Delta K_{dac}}\right) \Delta K_{dac} \quad (30)$$

$$K_{phz1} = \text{INT}\left(\frac{K'_{phz}}{\Delta K_{dac}}\right) \Delta K_{dac} \quad (31)$$

$$K_{phx2} = R \text{ FRAC}\left(\frac{K'_{phx}}{\Delta K_{dac}}\right) \Delta K_{dac} \quad (32)$$

$$K_{phy2} = R \text{ FRAC}\left(\frac{K'_{phy}}{\Delta K_{dac}}\right) \Delta K_{dac} \quad (33)$$

$$K_{phz2} = R \text{ FRAC}\left(\frac{K'_{phz}}{\Delta K_{dac}}\right) \Delta K_{dac} \quad (34)$$

$$R = \frac{T_{ph1}}{T_{ph2}} \quad (35)$$

$$A_{min} = T_{total} * (-) G_{phmax} \quad (36)$$

$$A_{max} = T_{total} * (+) G_{phmax} \quad (37)$$

$$A_{min}, (T_{tot} - 2\Delta T) G_{phmax}, (T_{tot} - 4\Delta T) G_{phmax}, \quad (38)$$

$$\ldots, -\Delta A, 0, \Delta A, \ldots A_{max}$$

$$T_{total} = N \Delta T \quad (39)$$

$$\Delta A = \frac{2}{N} A_{max} = \frac{2}{N} A_{min} \quad (40)$$

$$A_{min}, (T_{tot} - \Delta T) G_{phmax}, \ldots A_{max} \quad (41)$$

$$T_{total} = \frac{N}{2} \Delta T \quad (42)$$

What we claim is:

1. A method for a nuclear magnetic resonance (NMR) imaging apparatus having gradient coils driven by gradient waveforms, said gradient waveforms being produced by digital to analog converters having a predetermined amplitude quantization resolution or step size, said waveforms including a first phase encode waveform which, by an incremental variation of its area, provides a parameter to spatially encode an image of a subject, said method comprising the following steps:

for said first phase encode waveform, having a fixed width and a variable amplitude, determining a desired plurality of amplitudes for providing said incremental variation of said area;

providing a plurality of said first phase encode waveforms having actual amplitudes within one said step size of said desired amplitudes, said actual amplitudes corresponding to said amplitude quantization resolution, whereby an area error is created by the difference between said actual and desired amplitudes;

and in the same spin echo sequence as a said first phase encode waveform providing an additional phase encode waveform having a width substantially smaller by at least an order of magnitude than said first waveform, such area substantially matching said area error.

2. A method as in claim 1, where said additional waveform has a width measured by a time axis and a height measured by a magnitude axis and where said width is substantially smaller than the comparable width of said first waveform and said height is substantially similar.

3. A method as in claim 1, where said desired amplitudes are determined for three different axes as related to said gradient coils.

4. A method as in claim 2, where said widths have a predetermined ratio which is substantially proportional to an increase in resolution relative to said quantization step size.

5. A method as in claim 2, where said additional waveform includes portions having opposite polarity so that the effective area of such waveform is the algebraic sum of said portions.

6. A method as in claim 2, where said NMR apparatus includes both 90° and 180° excitation pulses and said additional waveform occurs in time after said 180° pulse but with a polarity opposite to said first waveform.

7. A method as in claim 1, where the area of said additional waveform is determined by a fraction analysis.

8. A method for a nuclear magnetic resonance (NMR) imaging apparatus having gradient coils driven by gradient waveforms, said gradient waveforms being produced by digital to analog converters having a predetermined amplitude quantization resolution or step size, said waveforms including a phase encode waveform which, by an incremental variation of its area, provides a parameter to spatially encode an image of a subject, said method comprising the following steps:

providing said phase encode waveforms with predetermined maximum positive and negative polarity amplitudes corresponding to said amplitude quantization resolution, said waveforms including a transition through a zero level connecting said positive and negative amplitudes, and incrementing the areas of said waveforms by varying the location in time of said transition.

9. A method as in claim 8 where said zero level determines said incrementing.

10. A method as in claim 8 where said phase encode waveform is formed by algebraically combining the following two waveforms;
(1) a fixed waveform starting initially in time at one of said maximum polarity amplitudes, making a transition to said zero level, staying at such zero level for the major time portion of such waveform, and then making a transition at its termination to the other maximum polarity amplitude; and
(2) a variable transition waveform having a first portion in time at said other maximum amplitude and a second portion in time at said one maximum amplitude with a transition which is varied in time connecting said portions.

* * * * *